US006645293B2

(12) United States Patent
Myerson

(10) Patent No.: US 6,645,293 B2
(45) Date of Patent: Nov. 11, 2003

(54) MOLECULAR CRYSTALS OF CONTROLLED SIZE

(75) Inventor: Allan S. Myerson, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 29 days.

(21) Appl. No.: 10/093,979

(22) Filed: Mar. 7, 2002

(65) Prior Publication Data
US 2003/0170999 A1 Sep. 11, 2003

(51) Int. Cl.[7] ................................................ C30B 7/00

(52) U.S. Cl. ........................................................ 117/68

(58) Field of Search ............................ 117/68, 920, 937

(56) References Cited
U.S. PATENT DOCUMENTS 5,476,944 A * 12/1995 Partis et al.

OTHER PUBLICATIONS

"Self–assembled monolayers of rigid thiols"; Ulman, et al; Reviews in Molecular Biotechnolog (2000), 74(3), pp. 175–188. ISSN:1389–0352.*

* cited by examiner

Primary Examiner—Felisa Hiteshaw
(74) Attorney, Agent, or Firm—Technoprop Colton LLC

(57) ABSTRACT

Methods for the crystallization of nano-size crystals of molecular organic compounds while operating at a low supersaturation. The methods are based on controlling the domain size available during the crystallization process. In one exemplary method, microcontacted printed self-assembled monolayers (SAMs) with local domain area sizes ranging up to 2500 $\mu m^2$ and fabricated SAMs generated from electron beam lithography, are employed to control the size, orientation, phase, and morphology of the crystal. In another exemplary method, a continuous micro-crystallizer having a vessel diameter of 25 microns or less is used to ensure that that the maximum size of the crystals in at least one dimension, ad preferably two dimensions is constrained by the vessel itself. The methods allow control of supersaturation and growth conditions, as well as manageability over crystallinity and polymorphism, and each method's domain size has the potential for further reduction.

56 Claims, 4 Drawing Sheets

MOLECULAR CRYSTALS OF CONTROLLED SIZE

BACKGROUND OF THE INVENTION

1. Technical Field

The present invention relates generally to the technical field of methods for the controlled nucleation and growth of crystals. Particularly, the present invention relates to the technical field of methods for the crystallization of nanometer and micron-sized crystals. More particularly, the present invention relates to the technical field of fabricating crystals of molecular organic compounds while operating at a low supersaturation.

2. Prior Art

Crystallization from solution is an important separation and purification process in the chemical process industries. It is the primary method for the production of a wide variety of materials ranging from inorganic compounds, such as calcium carbonate and soda ash, to high value-added materials, such as pharmaceuticals and specialty chemicals. In addition to product purity, crystallization must also produce particles of the desired size and shape, as well as particles of the desired polymorph.

Chemical species have the ability to crystallize into more than one distinct structure. This ability is called polymorphism (or, if the species is an element, allotropism). Different polymorphs of the same material can display significant changes in their properties, as well as in their structures. These properties include density, shape, vapor pressure, solubility, dissolution rate, bioavailability, and electrical conductivity. Polymorphism is quite common among the elements and also in inorganic and organic species. It is especially prevalent in organic molecular crystals, which often possess multiple polymorphs. The incidence of polymorphism in organic molecular crystals bears great significance to the pharmaceutical, dye, agricultural, chemical, and explosives industries.

Under a given set of conditions, one polymorph exists as the thermodynamically stable form. This is not to say, however, that the other polymorphs cannot exist or form in these conditions. It means only that one polymorph is stable while the other polymorphs can transform to the stable form. For example, acetaminophen (the active ingredient in Tylenol®) can exist in two forms. The thermodynamically stable phase has a monoclinic form of space group P21/n. A second, less stable phase can be obtained; this phase is orthorhombic (space group Pbca) and has a higher density indicative of a closer packing of the molecules.

In pharmaceutical product development, the most stable polymorph has, generally, been selected for employment in the final dosage product. Yet in recent years, metastable forms have often been utilized due to their enhanced dissolution and/or bioavailability. In these cases, an understanding of the stability of these metastable forms under processing and storage conditions has proven crucial for the safety and efficacy of the drug. The United States Food and Drug Administration regulates both the drug substance and the polymorph for all crystalline pharmaceuticals and requires extensive studies of polymorph stability.

To develop the optimal delivery method for a particular drug in the pharmaceutical industry, there exist two very important factors. These include the control of particle (crystal) size and shape and the production of the correct polymorph. In recent years, an increased interest in new drug delivery systems has developed, turning attention to direct injection (intravenous) methods and inhalation. These methods necessitate precise control of particle size, shape, and polymorph produced. Direct inhalation requires particles in the 1–3 micron range while direct injection requires particles in the 100–500 nanometer range.

Many different techniques are employed for particle size reduction, such as supercritical fluid crystallization, impinging jet crystallization, milling, and spray drying. However, each technique has its drawbacks. For instance, milling requires heat and, as a result, the solid may thermally degrade. Spray drying, supercritical fluid based crystallization, and other crystallization-based methods are contingent on the creation of a very high supersaturation, thus favoring particle nucleation over growth. While effective in making small particles, high supersaturation often results in amorphous materials or an undesired polymorph, rather than the desired form of the crystalline compound. This is particularly true in the case of organic molecular crystals, in which the forces holding the molecules together in the lattice prove relatively weak.

Crystallization from solution begins with the nucleation of crystals followed by the growth of these nuclei to finite size. Nucleation and growth follow separate kinetic regimes with nucleation normally being favored at high driving forces (supersaturation) and growth being favored at low supersaturations. Since the ratio of the rate of nucleation to growth during a crystallization process determines the crystal size distribution obtained, this means that high supersaturations are normally employed to produce small crystals. In attempting to produce crystals in the 1–5 micron range and crystals below 1 micron, this has led to the use of methods that produce very large supersaturations such as supercritical fluid crystallization and crystallization from an impinging jet. Both of these methods suffer from significant problems. One problem is that substances that form organic molecular crystals can be difficult to nucleate under high supersaturations and often produce amorphous material instead of the desired crystals. Another problem is that these methods are difficult to control, design and scale-up and have had little commercial success. A third problem is that these methods can produce an undesired polymorph because of the high levels of supersaturation used.

Organic monolayer films have been used as an interface across which geometric matching and interactions, such as van der Waals forces and hydrogen bonding, can transfer order and symmetry from the monolayer surface to a growing crystal. Nucleation and growth of organic crystals, nucleation rates, polymorphic selectivity, patterning of crystal, crystal morphology, and orientation (with respect to the surface) can undergo modification through site-directed nucleation. This can be achieved using supramolecular assemblies of organic molecules, such as chemically and spatially specific surfaces. Compressed at the plane of water/air interface, Langmuir monolayers are mobilized by, and commensurate with, the adsorption of aggregates during crystallization.

Self-assembled monolayers (SAMs) are single layers of ordered molecules adsorbed on a substrate due to bonding between the surface and molecular head group. SAMs are molecular units that are spontaneously formed upon certain substrates, such as gold and silicon, when immersed in an organic solvent. One of the better known methods to form SAMs is when alkanethiol molecules chemisorb on gold surfaces through the thiol head group to reproducibly form densely packed, robust, often crystalline monolayer films. The surface chemical and physical properties of the monolayer films can be controlled precisely by varying the terminal chemical functionality of the alkanethiol molecule.

SAMs and mixed SAMs lack the mobility of molecules at an air-water, interface and, hence, lack the ability to adjust lateral positions to match a face of a nucleating crystal. This is especially true for SAMs of rigid thiols, for which even conformational adjustment is not possible. SAMs of 4-mercaptobiphenyls are superior to those of alkanethiolate in providing stable model surfaces, as well as in the ability to engineer surface dipole moments. Coupled with the ability to engineer surface functionalities at the molecular level, SAMs and mixed SAMs of rigid thiol offer unique surfaces for nucleation and growth of inorganic and organic crystals.

Silane SAMs have been used to promote heterogeneous nucleation and growth of iron hydroxide crystals and to study the effect of surface chemistry on calcite nucleation, attachment, and growth. For example, $CaCO_3$ has been crystallized on surfaces of alkanethiolate SAMs on gold and SAMs of functionalized alkanethiols can control the oriented growth of calcite. Also, The heterogeneous nucleation and growth of malonic acid ($HOOCCH_2COOH$) has occurred on surfaces of alkanethiolate SAMs on gold that terminated with carboxylic acid and with methyl groups. However, while SAMs have been used to grow crystals, specifically patterned SAMs have not been used to limit the dimensions and sizes of crystals, or to grow distinct crystal of selected dimensions and sizes.

Therefore, it can be seen that there is a need for a method for producing crystals of a desired structure and finite size while limiting the production of amorphous materials. There also is a need for a method for producing micron and nanometer scale crystals that is less difficult to control, design and scale-up. There is a further need for a method for the production of organic molecular crystals of controlled size in the 1–5 micron range and the 100–1000 nanometer range. There also is a need for a simple, efficient and effective controlled method for the production of small sized crystals.

BRIEF SUMMARY OF THE INVENTION

Briefly described, the present invention is a novel route to producing small crystals and is based on the concept that such crystals can be produced using the modest supersaturations normally employed to crystallize most materials and controlling the crystal size by restricting the size and geometry of the crystallization domain. One example of a crystallization domain of controlled size and geometry is a self-assembled monolayer (SAM) with local domain area sizes selected to result in a crystal having the desired dimensions. Another example of a crystallization domain of controlled size and geometry is a capillary having a selected inner diameter for use as the crystallizer. More generally described, the present invention is a new process for the production of crystals of controlled size in the 1–5 micron and 100–1000 nanometer range by the use of a vessel geometry that limits the potential size of the crystals. The process is particularly suitable for the production of molecular organic crystals, but can be used to produce crystals from other types of compounds as well.

The present invention comprises at least two novel techniques for the crystallization of micron- and nanometer-size crystals of molecular organic compounds while operating at a low or modest supersaturation. Both methods are based on controlling the domain size available during the crystallization process, namely the crystallization vessel or equivalent (the crystallization domain). Both methods allow control of supersaturation and growth conditions, as well as manageability over crystallinity and polymorphism. Both methods domain size has the potential for further reduction, if necessary.

In a first method, the crystallization domain comprises microcontacted printed self-assembled monolayers (SAMs) with local domain area sizes ranging from 25 $\mu m^2$ to 2500 $\mu m^2$ and fabricated SAMs generated from electron beam (e-beam) lithography. These SAMs are employed to control the size, orientation, phase, and morphology of the crystal. Functionalized SAMs can serve as heterogeneous nucleants and promote the nucleation of organic, inorganic, and protein crystals.

In a second method, the crystallization domain comprises a continuous micro-crystallizer, such as a capillary or other confined structure. In this instance, the vessel diameter (for example, the inner diameter of the capillary) preferably is 25 microns or less to ensure that that the maximum size of the crystals in two dimensions is constrained by the vessel itself. The mother solution is introduced into the capillary and supersaturation created by cooling or the addition of an antisolvent or both. Crystallization then occurs, but the crystal can grow no larger than the inner diameter of the capillary in two of its three dimensions because of the restrictions due to the capillary. The third dimension of the crystal can be controlled by the residence time of the solution in the capillary. Those of skill in the art know of and can develop other vessels for producing such crystals, and the present invention is not meant to be limited to the production of crystals in a capillary or in the example vessels disclosed above.

There are a myriad of uses for the crystals produced by the present process. One use for such crystals in the 1–5 micron range is for the production of pharmaceuticals for inhalation therapies. One use for such crystals in the submicron (100–1000 nanometer) range is for the production of pharmaceuticals for direct injection. Those of skill in the art know of and can develop other uses for such crystals, and the present invention is not meant to be limited to the production of crystals for the examples given above.

That the present invention improves over the current art and addresses the needs in the technical field will become apparent when the following detailed description of the preferred embodiments is read in conjunction with the appended figures, in which like reference numerals represent like components throughout the several views.

DETAILED DESCRIPTION OF THE PREFERRED EMBODIMENTS

Figure 1:
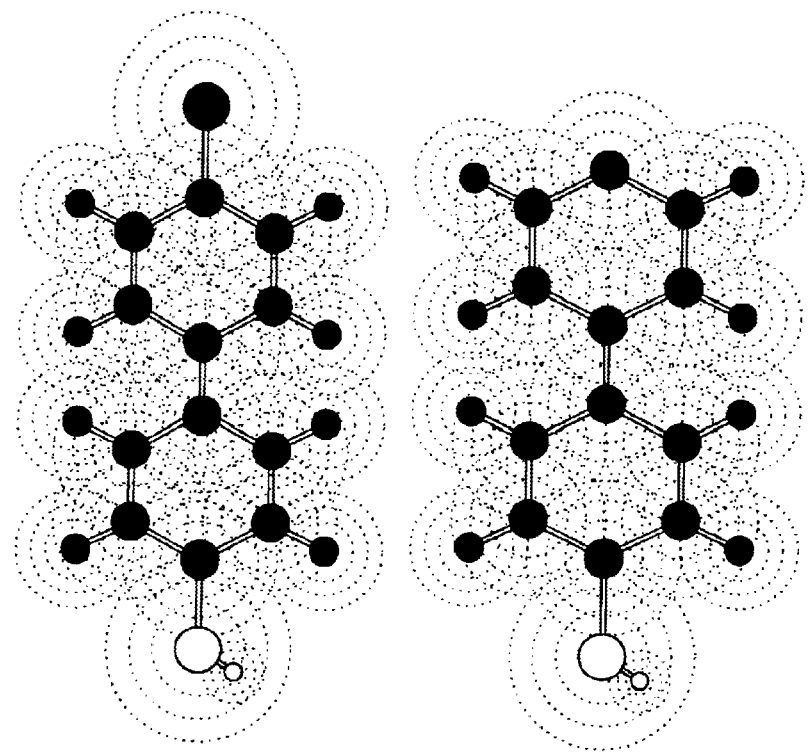
FIG. 1 illustrates example self-assembled monolayers (SAMs) of rigid biphenyl thiols that can be used as the crystallization domain for the present invention.

The present invention is a novel route to producing small crystals on the order of 100–1000 nanometers and 1–5 microns. The processes disclosed herein are based on the concept that such crystals can be produced by using the modest supersaturations normally employed to crystallize most materials, and by controlling the crystal size by restricting the size and geometry of the crystallization domain. Although many variations of the crystallization domain are contemplated by and suitable for carrying out the present process, two variations are disclosed herein as representative technologies.

As will become even more apparent below, the present invention comprises at least two novel techniques for the crystallization of micron- and nanometer-size crystals of molecular organic compounds while operating at a low or modest supersaturation. Both methods are based on controlling the domain size available during the crystallization process, namely the crystallization vessel or equivalent (termed the crystallization domain in this specification). Both methods allow control of supersaturation and growth conditions, as well as manageability over crystallinity and polymorphism, and each method's domain size has the potential for further reduction, if necessary. That is, while the illustrative methods for the present invention disclose producing crystals in the 1–5 micron range and the 100–1000 nanometer range, the size of the crystals produced only is dependent on the size of the crystallization domain, and smaller crystals can be made.

The first illustrative method involves the combination of molecularly engineered surfaces via self-assembly of rigid thiols with microcontact printing and E-beam lithography techniques. The goal is to obtain a surface whose features span from the mesoescopic to the nanoscopic scale for use in nucleation and growth experiments. The second illustrative method employs continuous crystallizers of controlled volumes in order to restrict the growth of the nucleating crystal through the size of vessel, and employs cooling means to initiate crystal nucleation. An alternative to the second illustrative method also employs continuous crystallizers of controlled volumes to restrict the growth of the nucleating crystal through the size of the vessel, but employs anti-solvent means to initiate crystal nucleation. In other words, in the second illustrative method, there are a number of ways to induce supersaturation, which include cooling, pH change, chemical reaction, solvent composition (addition of anti-solvent) and even evaporation.

These techniques allow the generation of micron or submicron particles with unique physical and chemical properties. Such techniques will have a significant impact on the development of new crystallization protocols. These crystallization protocols, in turn, could result in controlled solubility and delivery of biomolecules and pharmaceuticals. Moreover, the ability to create surface features through designed chemistry offers a unique opportunity to address some of the fundamental questions of nucleation and growth.

More specifically, the first illustrative example of a crystallization domain of controlled size and geometry is a self-assembled monolayer (SAM) with local domain area sizes selected to result in a crystal having the desired dimensions. In this first illustrative method, the crystallization domain comprises microcontacted printed self-assembled monolayers (SAMs) with local domain area sizes ranging from 25 $\mu m^2$ to 2500 $\mu m^2$ and fabricated SAMs generated from electron beam (e-beam) lithography. These SAMs are employed to control the size, orientation, phase, and morphology of the crystal. Functionalized SAMs can serve as heterogeneous nucleants and promote the nucleation of organic, inorganic, and protein crystals. SAM regions can be divided into smaller regions on which the small crystals grow. The smaller regions can be separated from each other by chemical or physical barriers, with the barriers acting as the sidewalls of the crystallization domain. Each smaller region therefore can have dimensions on the micron or nanometer, or smaller, scale.

More specifically, the second illustrative example of a crystallization domain of controlled size and geometry is a straight tube capillary having a selected inner diameter for use as the crystallizer. In this second illustrative method, the crystallization domain comprises a continuous microcrystallizer, such as the capillary or other confined structure. In this instance, the vessel diameter or cross-section (for example, the inner diameter of the capillary) preferably is 25 microns or less, and even more preferably 5 microns or less, to ensure that that the maximum size of the crystals in two dimensions is constrained by the vessel itself. The mother solution is pumped into the capillary and supersaturation is created by cooling. Crystallization then occurs, but the crystal can grow no larger than the inner diameter or cross-section of the capillary in two of its three dimensions because of the restrictions due to the capillary. The third dimension of the crystal can be controlled by the residence time of the solution in the capillary.

More specifically, an alternative embodiment of the second illustrative example of a crystallization domain of controlled size and geometry is a Y-tube capillary having a selected inner diameter for use as the crystallizer. In this alternative of the second illustrative method, the crystallization domain also comprises a continuous microcrystallizer, such as the capillary or other confined structure. In this instance, the vessel diameter or cross-section (for example, the inner diameter of the capillary) also preferably is 25 microns or less, and even more preferably 5 microns or less, to ensure that that the maximum size of the crystals in two dimensions is constrained by the vessel itself. The mother solution is pumped into the reaction region of the capillary through a first arm of the Y, and supersaturation is created by pumping an anti-solvent into the reaction region of the capillary through a second arm of the Y. Crystallization then occurs, but again the crystal can grow no larger than the inner diameter or cross-section of the capillary in two of its three dimensions because of the restrictions due to the capillary. The third dimension of the crystal can be controlled by the residence time of the solution in the reaction region of the capillary.

Those of skill in the art can develop other vessels for producing such crystals, and the present invention is not meant to be limited to the production of crystals in a SAM region or capillary or in the example vessels disclosed above.

1. Nucleation and Growth of Crystals on SAMs

One aspect of the present invention uses SAMs and mixed SAMs to create a region of controlled size for the production of crystals having selected and finite dimensions and sizes. As illustrated in FIG. 1, the use of SAMs and mixed SAMs of biphenyl thiols on gold according to the present process can serve as nucleation planes while allowing for control at the molecular level.

Figure 2:
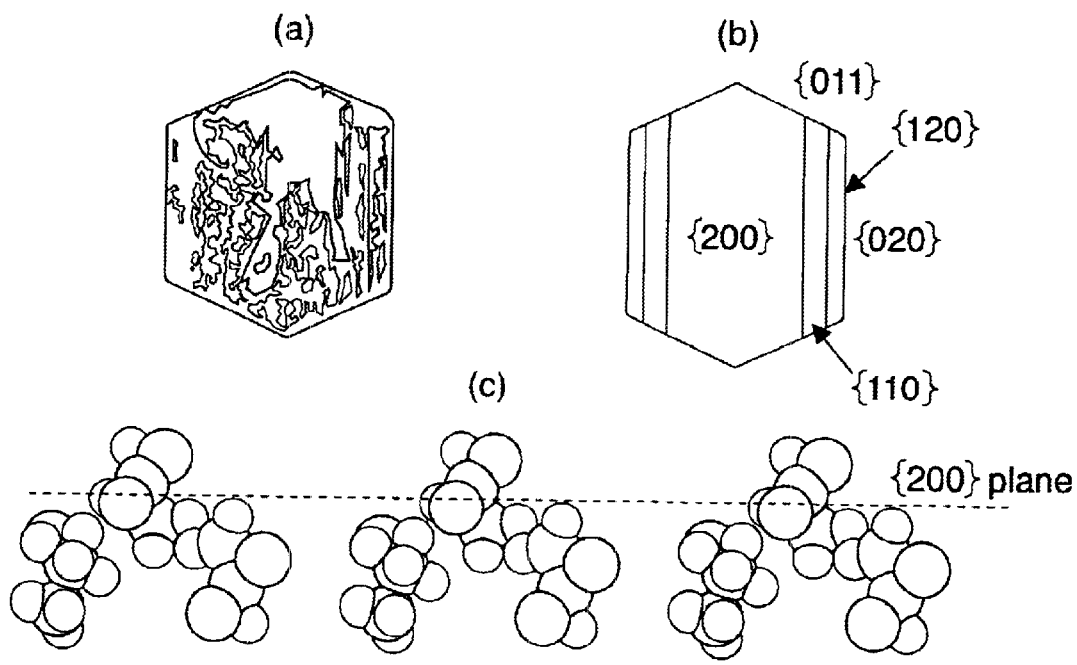
FIG. 2A is the crystallographic image of L-alanine crystal nucleated on SAMs of 4'-hydroxy-4-mercaptobiphenyl on gold (111) surface.
FIG. 2B is the morphology of L-alanine crystal nucleated on SAMs of 4'hydroxy-4-mercaptobiphenyl on gold (111) surface.
FIG. 2C is the molecular structure of the {200} plane of L-alanine crystal nucleated on SAMs of 4'-hydroxy4-mercaptobiphenyl on gold (111) surface.

To illustrate this in more detail, SAMs and mixed SAMs of 4'-hydroxy-4-mercaptobiphenyl, 4-(4-mercaptophenyl) pyridine, and their mixed SAMs with 4'-methyl-4-mercaptobiphenyl were prepared on gold (111) surfaces and used as templates for the nucleation and growth of glycine crystals. Glycine nucleates in the α-glycine structure independent of hydroxy or pyridine surface concentration. In other cases of amino acids, the functionalized SAMs induce the formation of L-alanine crystals, as shown in FIGS. 2A, 2B, and 2C, and DL valine.

During crystal growth, subtle differences in the variations of SAM surfaces lead to different interfacial interaction, thereby stimulating oriented crystallization of amino acids. Other factors, such as temperature, solvent, impurities and hydrodynamics (vibrations), also can affect the crystal morphology. In the examples presented herein, each factor was maintained constant and the only two variables were the surface composition and the solution concentration. This allowed for the systematic change of hydrogen bonding and supersaturation and the investigation of their effect on crystallization and nucleation. It was observed that hydrogen bonding is specifically responsible for the epitaxial crystallization of α-glycine, L-alanine, and DL-valine on the monolayer substrates. Furthermore, it was noted that the amino acids that nucleated independently of the supersaturation and the crystallographic planes, corresponding to nucleation, did not change. Thus, the employment of SAMs of biphenyl rigid thiols as supramolecular templates controls and promotes the nucleation of amino acids, and provides an alternative route to crystal engineering.

In other examples of the present process, SAMs of biphenyl thiolates with different chemical functionalities were used for nucleation and growth of amino acids, proteins, and pharmaceutical-related compounds. Molecular modeling studies in general, and binding energy calculations in particular, show the affinity between SAMs and mixed SAMs of 4'-substituted-4-mercaptobiphenyls on gold surfaces as well as particular amino acid crystal faces. For prominent {hkl} faces, it was observed that minimum negative binding energies correlated with the crystallographic planes that had nucleated on the SAM surfaces. This suggests that binding energies calculations can screen potential SAMs, using them as templates for nucleation and growth of organic and inorganic crystals. As a result, the most promising chemical functionalities now can be selected when growing crystals. Additionally, chain length, geometry, and chemistry of, for example, alkanethiols ($SH(CH_2)_nX$) terminated with $CO_2^-$, $SO_3^-$, $PO_3^-$, $NH_3^+$, $N(CH_3)_3^+$, $NO_2$ and OH supported on gold and silver surfaces, also can have an effect on the resulting crystal. Moreover, amino acid monolayers, such as L-cysteine and D-cysteine, can be used to control the size and polymorphs of glycine and other amino acids, including alanine, valine, glutamic acid, leucine, cysteine, and phenylalanine.

Pharmaceutical compounds provide a practical model for the present process. Specifically, paracetmol, ibuoprofen, theophylline, carbamazepine, sulfathiazole, itraconazole, and other related compounds are presented as models as these compounds are of great interest to the medical and research communities. The example pharmaceutical compounds chosen are commercially important, have more then one polymorph and/or will form an amorphous solid under high supersaturation. As is generally known to those of skill in the art, pharmaceutical unit operations such as milling, spray drying and supercritical fluid crystallization where high supersaturations are required to fabricate nanometer and micron size particles generally lead to crystal defects and amorphous regions. However, using the present process with patterned SAMs allows the operation at low supersaturations and the control of the crystal growth. This, in turn, allows for control of the desired form of the crystalline compound, rather than the undesired polymorph, as well as control of particle size, particle morphology, and shape distribution.

Amino acids also are presented as model compounds for several reasons, including: (i) amino acids are relatively easy to grow in aqueous and alcohol solutions; (ii) almost all the amino acids have more that one crystal structure (or polymorph); (iii) there is an extensive background and information on the crystallization of each amino acids; and (iv) at high supersaturations, the nanometer and micron sized amino acid crystals are amorphous or semicrystalline.

Patterning using SAMs is known and has attracted growing attention due to its potential applications in sensor design, microelectronic devices, in addition to many other uses. To date, structures of various SAMs on gold, with a characteristic scale of 0.1–100 μm, have been generated using microcontact printing, micromachining, focused ion beam writing, photolithography/lift off, and microwriting. Of these techniques, the most versatile is microcontact printing.

Figure 3:
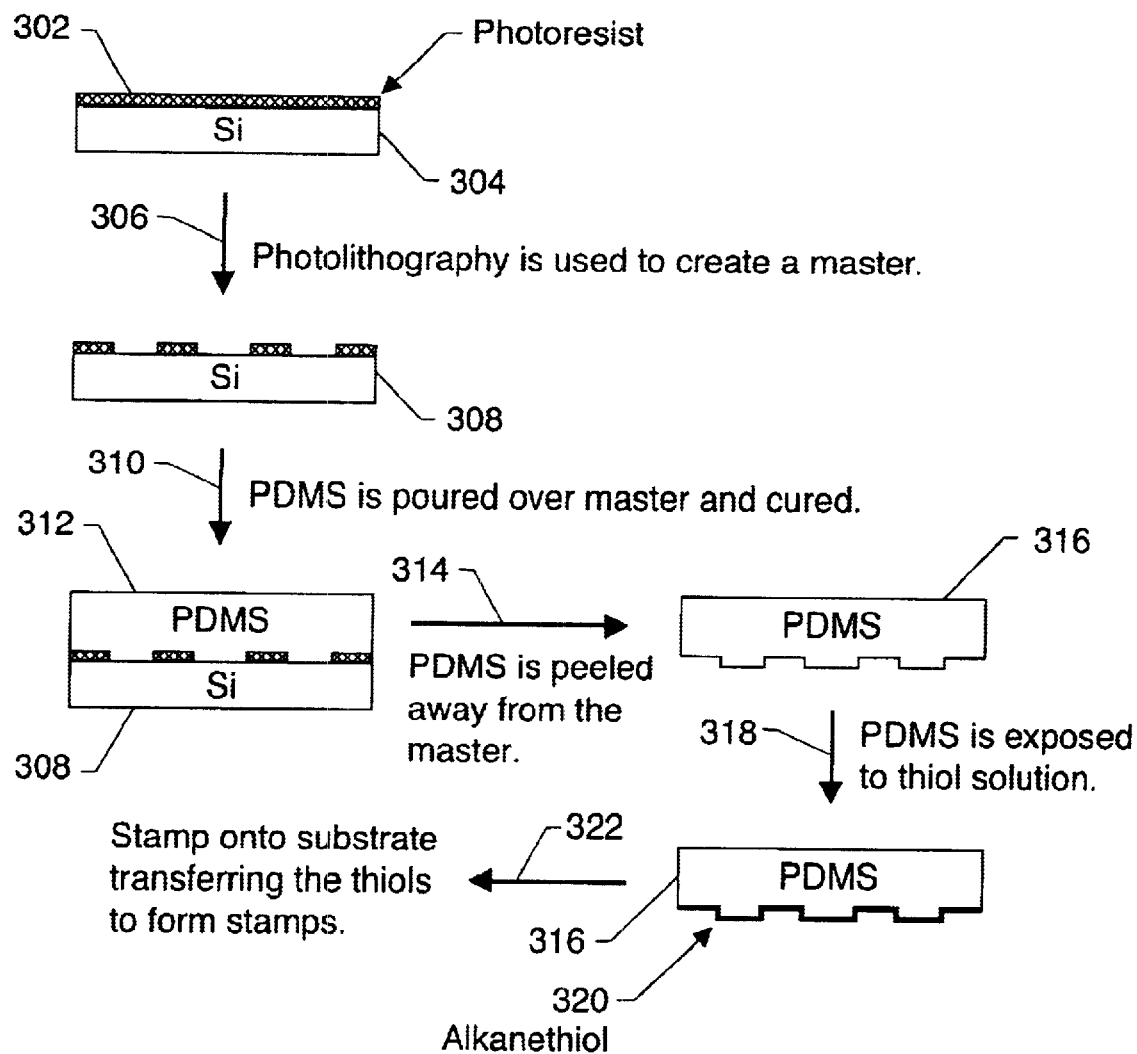
FIG. 3 illustrates the scheme procedures to pattern the crystal surface using microcontact printing.

As illustrated in FIG. 3, the use of a patterned elastomeric stamp 316 to transfer the alkanethiol 320 to the surface of the substrate by contact serves as the basis of the microcontact method. A master 308 is formed by subjecting a base 304, typically silicon, coated with a photoresist 302 to photolithography 306 to form a pattern of the photoresist 302 on the base 304. Other methods of forming the pattern on the base 304, and thus forming the master 308 are known in the art.

The stamp 316 is formed by casting polydimethyl siloxane elastomer (PDMS) 312 on a master 308. The PDMS stamp 316 then is removed 314 from the master 308. The stamp 316, inked 318 with alkanethiol 320 and blown dry in a stream of nitrogen, is applied to the surface of the gold substrate, where very light pressure is administered to ensure complete contact between the stamp 316 and the surface. The stamp 316 is then gently peeled from the surface, forming SAMs in regions where stamp and surface met. Next, the patterned gold surface is exposed to a chemical etchant that selectively etches underivatized regions of gold. A wash of diluted alkanethiol then further derivatizes the surface. Patterned SAMs fabricated from microcontact printing routinely feature size at the 500-nm scale. For patterned surfaces with nanometer sizes (<50 nm), high-resolution electron beam lithography can be used. In brief, one known technique consists of scanning a beam of electrons across a surface covered with a resistant film.

Domain area sizes for patterned SAMs generated from microcontact printing range from 25 $\mu m^2$ to 2500 $\mu m^2$ and can be controlled by photolithography when preparing the master. Additionally, different micrometer-sized patterns can be fabricated such as circles, rectangles, squares, and other two-dimensional shapes that will be separated by spaces. Specifically, illustrative examples for the present process include templated-crystallization performed at low supersaturations (5%, 10%, 15%, 20%, 25%, 30%, 40% and 50%) to exemplify their effects in conjunction with the effects of the geometry, chemistry and domain size of the organic surfaces. Transmission electron microscopy, scanning electron microscopy, optical microscopy and synchrotron x-ray powder diffraction all can be employed to characterize the size, density, crystallinity, morphology, orientation, and form of the crystals.

The patterned surfaces used to exemplify the present process consist of two functionalized SAMs: (i) SAMs that are generated from the PDMS stamp, terminated with selected functional groups (e.g. OH, $CO_2^-$, $SO_3^-$, $PO_3^-$, and $NO_2$), and other possible monolayer surfaces that promote nucleation; and (ii) SAMs that inhibit crystallization such as $NH_3^+$-terminated SAMs. For SAMs of rigid biphenyl thiols, molecular modeling studies (binding energy calculations) were used to aid in selecting monolayer surfaces (terminated in H, $CH_3$, $CF_3$, $C_6H_5$, F, Cl, Br, I, OH, SH, $NO_2$, $SCH_3$, $CO_2Et$, $OCH_2CH_2OCH_3$, and $N(CH_3)_2$) that can possibly inhibit crystallization, or in selecting organic surfaces that will can serve as templates for nucleation and growth of crystals of a particular molecular compound or crystalline form (polymorph) of interest.

Figure 4:
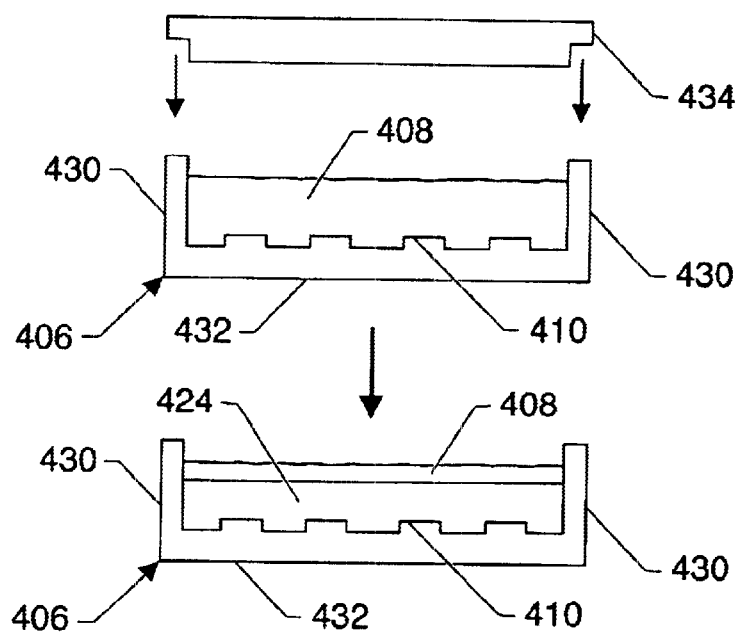
FIG. 4 is a stylized schematic flow chart of the scheme procedures to pattern the crystal surface using SAMs.

Referring now to FIG. 4, a general scheme for controlling the dimensions, size, and/or pattern of crystals according to the present invention is shown. After constructing the stamp and forming the SAM, as illustrated in FIG. 3, the combination is used as the crystallization domain 406. A supersaturated solution of a compound of interest in a solvent is produced. The supersaturation level of the solution need not be high, and it is preferable to be as low as practicable. It is preferred that the supersaturation level not exceed 100% of the equilibrium concentration, and preferably be between 1% and 50% of the equilibrium concentration. The supersaturated solution then is introduced to the crystallization domain 406. For example, once the desired SAM is formed, it can be placed in the solution containing the compound of interest. The solution containing the compound of interest then is supersaturated, generally by any method, and crystals grow on the SAM. The SAM provides a molecular template for the crystal and entices it to grow.

The crystallization domain 406 can be used in different fashions. The two primary fashions are (1) to create a crystal having a selected size in one or two dimensions and (2) to create a crystal having a patterned face. Although other uses for the crystallization domain 406 are contemplated, the two uses mentioned above will be used as illustrative examples for the present process. These SAM-related processes are particularly suitable for producing crystals on the nanometer size scale. Specifically, crystals having at least one dimension on the 100–1000 nanometer range or smaller can be produced using this process.

To create a crystal having a selected size in one or two dimensions, the stamp pattern is made to the dimensions of interest. For example, a circular pattern having a specific diameter, a square pattern having a specific side length, or a rectangular pattern having a specific length and width can be created. The supersaturated solution is introduced to the pattern 410 and allowed to nucleate. The resulting crystal 424 grows within the pattern 410, but is constrained in size and dimension by the shape of the pattern 410. In this example, the pattern 410 is constructed to the size, in one or two dimensions, of the desired crystal, and preferably is on the order of microns or nanometers.

The pattern 410 preferably has side walls 430 (corresponding to the selected size and dimensions) and a bottom wall 432 (for retaining the supersaturated solution 408), but may or may not have a top wall 434. Without a top wall 434, the crystal 424 may continue to grow in the upward direction (or the equivalent direction if the top is not oriented upwards relative to the conventional horizon) until all of the compound of interest has crystallized or until crystallization is otherwise stopped. This allows the growing of a crystal 424 of finite size in one or two dimensions and of a selected size in the third dimension (that is, the crystal 424 can be grown in the third dimension until crystallization is artificially stopped). With a top wall 434, the crystal 424 can be confined to a three-dimensional shape dictated by the walls 430, 432, 434.

Figure 5:
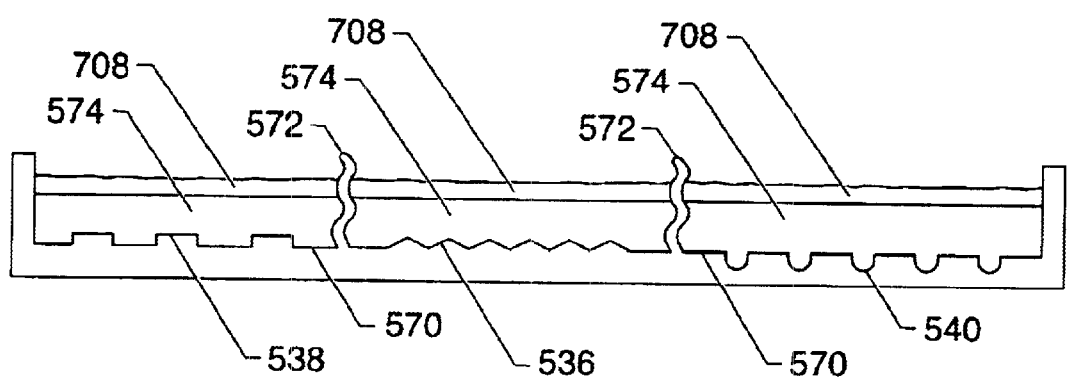
FIG. 5 is a stylized schematic for growing a plurality of crystals on a single SAM substrate.

Alternatively, as shown in FIG. 5 a single larger pattern 570 can be divided into smaller regions using chemical or physical barriers 572. This allows a plurality of crystals 574 to be grown on the single larger pattern 570, with the crystal 574 size being constrained by the chemical or physical barriers 572. A single larger pattern 570 often is easier to handle, and growing a plurality of crystals at once often is more efficient and cost-effective.

To create a crystal having a patterned face, the stamp pattern is made to the pattern of interest. For example, a saw-tooth pattern 536, a step-wave pattern 538, or a dimple pattern 540 can be created. The supersaturated solution 508 is introduced to the pattern 536 and allowed to nucleate. The resulting crystal 542 grows within the pattern 536, and takes on the shape, size and dimensions of the pattern 536.

These SAM-based processes are the equivalent of batch flow processes. A crystal is grown within the pattern or on the pattern and then removed from the pattern. A new crystal then is grown within the pattern or on the pattern. This process is repeated for so long as the crystals are desired.

Using this technique, crystals can be grown within a temperature range of 0° C. to 100 C., and preferably in the 5° C. to 40° C. temperature range. One factor in choosing the temperature for the crystal growth is the temperature at which the compound of interest would precipitate out of the supersaturated solution. Other factors are the other physical and chemical characteristics of the compound of interest and the SAM substrate. The residence time for growing the crystals in this technique are on the order of from minutes to days, depending on the growth rate of the compound of interest.

Compounds of interest include anything that crystallizes. The process is especially suitable for organic molecules in a solvent used to create organic crystals. Preferred compounds of interest are organic compounds including, but not limited to, glycine, alanine, glutamic acid, asparagine, phenylalanine, amoxcillin, paracetmol, ibuoprofen, theophylline, carbamazepine, sulfathiazole, itraconazole, and others.

Suitable solvents include organic and inorganic solvents. The solvent, if used, should be compatible with the compound of interest. That is, the compound of interest must be soluble in the solvent, and the compound/solvent solution must be capable of supersaturation, and the solvent should be selected accordingly. Those of skill in the art will be able to match and appropriate solvent to the chosen compound of interest. Although the preferred solvent is water, other suitable solvents include, but are not limited to, organic, inorganic, and supercritical solvents. Once a compound of interest is selected for producing crystals, the appropriate solvent is selected. Those of ordinary skill in the art can determine the appropriate solvent for a selected compound of interest without undue experimentation.

2. Crystallization in Controlled Volumes

Many different approaches are used to fabricate nanometer and micron sized particles. These include supercritical fluid crystallization, impinging jet crystallization, spray drying, and milling. Yet none of these techniques is performed in confined spaces. Crystallization within confined spaces often is observed in biological and material science research, such as the synthesis and preparation of nanoparticles for catalysis, semiconductors, and optoelectronics, as well as the interfacial crystallization processes in biological organisms. This approach has been used to generate nanometer and micron scale materials, offering unique and various chemical and physical properties when compared to bulk materials. One such case uses water-in-oil microemulsions to crystallize a new polymorphic form of aspartame, a dipeptide consisting of a highly hydrophilic aspartyl and a very hydrophobic phenylalanine methyl ester end. When the artificial sweetener, aspartame, crystallized in water/isooctane microemulsions that were stablilized with sodium diisooctyl sulfosuccinate (AOT), a unique and distinct X-ray powder diffraction powder pattern was obtained. It was observed that this new crystal form possesses drastically enhanced dissolution kinetics, which, of course, serves a great commercial interest due to its high sweetening power (150 to 200 times sweeter than sucrose).

Crystallization in controlled volumes, such as emulsified droplets, also has revealed that the double water-in-oil-water emulsion systems prove useful as a biomimetic environment for the synthesis of calcium carbonate particles. In changing the pH or the method of demulsification, both the polymorphic and physical forms of the particles could be controlled. In the crystallization of glycine and phenylalanine from water-isoctane microemulsions, stabilized by sodium di2-ethylhexyl sulfosuccinate (AOT), a significant decrease in the crystal size of glycine was observed, as compared with crystals formed in aqueous solution, which typically grow to millimeters in size. The glycine crystals ranged in size from submicron to micron. The γ-form predominately appeared from microemulsions, whereas the α-form was observed only in aqueous solution. In the case of phenylalanine, the size of the crystal was also reduced due to the confined space. The plate-like β-form polymorph was observed while typically both the needle-like α-form and plate-like β-form are crystallized in aqueous solution. With increasing importance placed on desired crystalline form, morphology, and size control in the synthesis of organic and pharmaceutical materials, novel techniques prove essential in order to engineer these molecular organic compounds.

Figure 6:
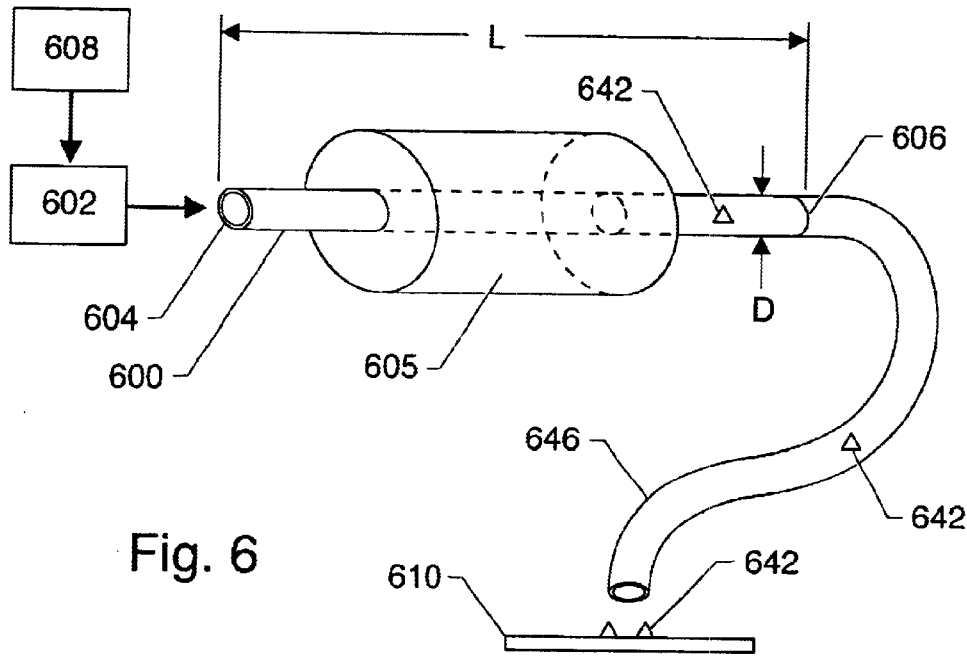
FIG. 6 illustrates a schematic of the straight tube mixer of the capillary type that can be used as the crystallization domain for reaction crystallization in an alternate embodiment of the present invention.
Figure 7:
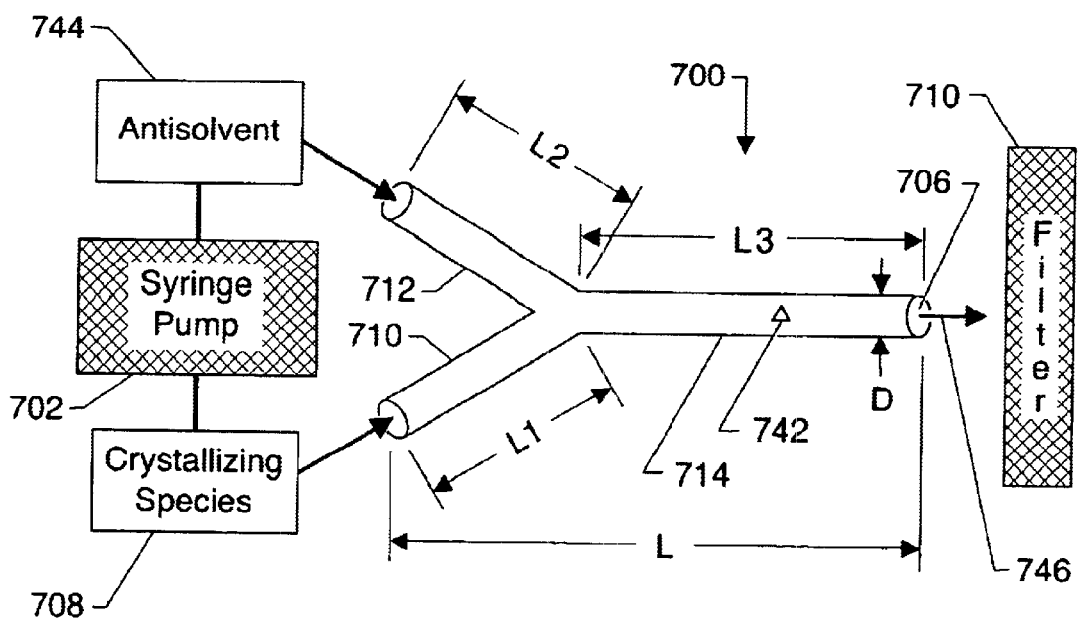
FIG. 7 illustrates a schematic of the Y-mixer of the capillary type that can be used as the crystallization domain for reaction crystallization in an alternate embodiment of the present invention.

In the present process, micro-crystallizers are used to produce crystals on the micron scale. Two different types of continuous micro-crystallizers will be described herein as illustrative of the process used to fabricate micron sized crystals. FIG. 6 illustrates the use of a linear capillary micro-crystallizer 600 and FIG. 7 illustrates the use of a Y-shaped capillary micro-crystallizer 700. Other shapes of micro-crystallizers are contemplated, such as, but not limited to, reaction vessels having round, oval, square and rectangular cross-sections; constant and increasing cross-sections; and troughs.

Referring now to FIG. 6, the crystallizer 600 is a straight capillary tube with a defined length L and diameter D. For the general purposes of the invention, and for producing the crystals of most interest, a tube length of 200 mm and an inner diameter of diameter of 25 microns or less, and preferably in the 1–5 micron range, have been found to be suitable. Both the length and the diameter of the capillary tube can be adjusted, typically depending on the size of the crystal desired and the residence time necessary to produce the crystal of interest. Thus, tube diameters or cross-sections can be made as large or small as desired, including in the nanometer range. Material and compound characteristics would be two of the limits for the actual size of the tube diameter or cross-section.

A saturated solution 608 of the compound of interest is introduced into the crystallizer 600, preferably via a syringe pump 602 at the entrance 604. The capillary tube crystallizer 600 typically is placed in a water bath 605 operating at low temperatures (5° C., 10° C., 15° C., and 20° C.), which is used to initiate the supersaturation driving force for crystallization. Crystallization occurs inside the confined space of the crystallizer 600. At the exit 606, a tube 646 can be connected that leads the crystals 642 to a micro filter 610 where the crystals 642 are then dried and characterized.

The residence time inside the crystallizer 600 is controlled by the pumping rate of the syringe 602 and ranges from 30 seconds to 5 hours (300 minutes) or longer, depending to a certain extent on the growth rate for the crystals 642 of the compound of interest. Transmission and scanning electron microcopy, optical microscopy, particle size analyzer and synchrotron x-ray powder diffraction can be performed to characterize the phase, density, morphology, size distribution and morphology of the crystals 642. Additionally, treating the crystallizer 600 as a plug flow reactor, the crystallization kinetics as well as the analysis of the crystallizer 600 can be determined by the population balance. Amino acids, antibiotics and pharmaceutically related compounds are the preferred compounds of interest due to their ability to have more than one crystalline form and their amorphous and semi-crystalline state at high supersaturations.

Referring now to FIG. 7, the crystallizer 700 a Y-mixer and supersaturation hence crystallization occurs by the addition of an anti-solvent. The Y-mixer has two identical inlet arms 710, 712, an outlet arm (mixing arm) 714, and an inner diameter D. For the general purposes of the invention, and for producing the crystals of most interest, the entire length L of crystallizer 700 suitably is 200 mm, as in the straight capillary crystallizer 600 disclosed above. The inlet arms 710, 712 suitably are 50 mm each in length L1, L2, and the outlet arm 714 suitably is 150 mm in length L3. Both the length and the diameter of the inlet arms 710, 712 and the outlet arm 714 can be adjusted, typically depending on the size of the crystal desired and the residence time necessary to produce the crystal of interest.

Crystallizer 700 comprises two inlet arms 710, 712 rather than simply a single entrance, such as entrance 604 of crystallizer 600, so that crystallizer 700 can be used with a combination of saturated solution 708 and an anti-solvent 744. The use of an anti-solvent is necessary to initiate crystallization in cases in which the solubility of the crystallizing species does not vary with temperature to a large enough degree to allow crystallization by cooling. Specifically, unlike in the straight tube crystallizer disclosed above, the Y-tube crystallizer is not meant to be submerged in a cooling bath or otherwise cooled to initiate crystallization. Therefore, another means for initiating crystallization is required, such as the anti-solvent. However, a combination of using an anti-solvent and cooling (such as submerging the Y-tube in a cooling bath) can be employed to increase or decrease the rate of crystallization.

A syringe pump 702 also can be used to propel the two reactant solution streams (the supersaturated solution 708 stream and the anti-solvent 744 stream) through each of the two inlet arms 710, 712 of the Y-crystallizer 700. Precipitation will take place in the outlet arm 714, where the two streams are diffusively being mixed. Residence times in the mixing arm 714 ranges from 30 seconds to 10 hours (or 600 minutes) or longer depending on the flow rate of the two streams being pumped and the growth rate of the crystals 742 of the compound of interest, among other factors. At the exit 706, a tube 746 can be connected to lead the crystals 742 to a micro filter 710 where the crystals 742 are then dried and characterized. The characterization techniques disclosed above also can be performed on the crystals 742 and the crystallizer 700 can be analyzed using the population balance method.

Compounds of interest include anything that crystallizes. The process is especially suitable for organic molecules in a solvent used to create organic crystals. Preferred compounds of interest are organic compounds including, but not limited to, amino acids, antibiotics and pharmaceutically related compounds, such as glycine, alanine, glutamic acid, asparagine, phenylalanine, amoxcillin, paracetmol, ibuoprofen, theophylline, carbamazepine, sulfathiazole, itraconazole, and others.

Suitable solvents include organic and inorganic solvents. The solvent, if used, should be compatible with the compound of interest. That is, the compound of interest must be soluble in the solvent, and the compound/solvent solution must be capable of supersaturation, and the solvent should be selected accordingly. Those of skill in the art will be able to match and appropriate solvent to the chosen compound of interest. Although the preferred solvent is water, other suitable solvents include aliphatic alcohols, such as isopropanol, methanol, and ethanol, or possibly water (if the compounds are soluble in organics), as well as other precipitating agents known to reduce the solubility of the compound.

Both methods constrain the size of the crystal by the vessel 600, 700, allowing control of the supersaturation and crystal growth conditions, which, in turn, control crystallinity and polymorphism. The crystallizers 600, 700 in general, and the vessel diameter D in particular, can be further constrained by employing microfluidic devices fabricated by soft lithography where the diameter can go as low as 1–5 $\mu$m or smaller. Additionally, incorporation of static or passive mixers in these devices can greatly improve the mixing at the outlet arm, which in turn improves the crystallization process.

3. Order of Steps and Equivalents

Certain steps in the process described herein must naturally precede others for the present invention to function as described. However, the present invention is not limited to the order of the steps described if such order or sequence does not alter the functionality of the present invention. That is, it is recognized that some steps may be performed before or after other steps without departing from the scope and spirit of the present invention. Further, certain steps can be eliminated and other steps added without departing from the scope and spirit of the present invention.

As such, the above detailed description of the preferred embodiments, including the example methods and products, and the appended figures are for illustrative purposes only and are not intended to limit the scope and spirit of the invention, and its equivalents, as defined by the appended claims. One skilled in the art will recognize that many variations and modifications can be made to the invention disclosed in this specification without departing from the scope and spirit of the invention.

What is claimed is:

1. A process for producing crystals having at least one dimension less than 25 microns, said process comprising the steps of:

providing a crystallization domain having a controlled volume, said controlled volume having at least one dimension less than 25 microns;

introducing a supersaturated solution comprising a compound of interest to said controlled volume;

allowing said compound of interest to crystallize from said supersaturated solution while within said controlled volume and to grow into crystals, wherein said controlled volume restricts said crystals to having at least one dimension of less than 25 microns.

2. The process as claimed in claim 1, wherein said crystals grow in at least two dimensions, a first dimension of which is restricted to less than 25 microns by said controlled volume, and a second dimension of which is controlled by the residence time of the supersaturated solution in the controlled volume.

3. The process as claimed in claim 2, further comprising the step of removing said crystal from said controlled volume when the second dimension reaches a selected value.

4. The process as claimed in claim 3, further comprising the step of patterning a self-assembled monolayer to form said controlled volume.

5. The process as claimed in claim 4, wherein said crystals have at least one dimension in the 100–1000 nanometer range.

6. The process as claimed in claim 5, further comprising the steps of:

generating a pattered substrate by forming a pattern of a self-assembled monolayer on a substrate, wherein said pattern comprises at least one region having at least one dimension in the 100–1000 nanometer range; and subjecting said patterned substrate to the supersaturated solution containing the compound of interest, wherein the compound of interest crystallizes within said patterned self-assembled monolayer to form crystals of the compound of interest and said at least one region limits the growth of the crystals of the compound of interest.

7. The process as claimed in claim 6, wherein said patterned substrate is formed in a process comprising the steps of:

coating a master substrate with a substance that can be patterned;

creating a pattern in said substance;

creating a stamp of said pattern by casting a casting substance on said pattern;

inking said stamp with an inking substance capable of forming a self-assembled monolayer to create an inked stamp;

contacting said inked stamp to said substrate, wherein self-assembled monolayers form in the regions where said inked stamp and said substrate contact thereby forming said patterned substrate.

8. The process as claimed in claim 7, wherein said pattern comprises at least one two-dimensional subregion, wherein at least one dimension of said subregion is in the 100–1000 nanometer range.

9. The process as claimed in claim 8, wherein said pattern comprises at least one two-dimensional subregion, wherein both dimensions of said subregion are in the 100–1000 nanometer range.

10. The process as claimed in claim 3, further comprising the step of selecting a reaction vessel to use as said controlled volume.

11. The process as claimed in claim 10, wherein said crystals have at least one dimension in the 1–5 micron range.

12. The process as claimed in claim 11, further comprising the steps of:
  introducing said supersaturated solution to said reaction vessel, wherein said reaction vessel comprises at least one dimension in the 1–5 micron range; and
  allowing said supersaturated solution to crystallize wherein the compound of interest crystallizes within said reaction vessel to form crystals of the compound of interest and said reaction vessel limits the growth of the crystals of the compound of interest.

13. The process as claimed in claim 12, further comprising the step of introducing an anti-solvent to the reaction vessel with the supersaturated solution.

14. The process as claimed in claim 13, wherein the process is a plug-flow process and said crystal comprises at least two crystal dimensions, and further comprising the step of flushing said crystal from said reaction vessel when a first crystal dimension is in the 1–5 micron range and a second crystal dimension reaches a selected value.

15. The process as claimed in claim 14, wherein said reaction vessel comprises at least two dimensions in the 1–5 micron range.

16. A process for producing crystals having at least one dimension in the 100–1000 nanometer range, said process comprising the steps of:
  generating a pattered substrate by forming a pattern of a self-assembled monolayer on a substrate, wherein said pattern comprises a region having at least one dimension in the 100–1000 nanometer range; and
  subjecting said patterned substrate to a supersaturated solution containing a compound of interest,
  wherein the compound of interest crystallizes within said region to form crystals of the compound of interest and said region limits the growth of the crystals of the compound of interest.

17. The process as claimed in claim 16, wherein said pattern for said self-assembled monolayer is generated by a technique selected from the group consisting of microcontact printing, micromachining, focused ion beam writing, photolithography/lift off, and microwriting.

18. The process as claimed in claim 16, wherein said pattern for said patterned self-assembled monolayer is generated using microcontact printing.

19. The process as claimed in claim 18, wherein said patterned substrate is formed in a process comprising the steps of:
  coating a master substrate with a substance that can be patterned;
  creating a pattern having at least one region in said substance;
  creating a stamp of said pattern by casting a casting substance on said pattern;
  inking said stamp with an inking substance capable of forming a self-assembled monolayer to create an inked stamp;
  contacting said inked stamp to said substrate,
  wherein self-assembled monolayers form in said at least one region where said inked stamp and said substrate contact thereby forming said patterned substrate.

20. The process as claimed in claim 19, wherein said casting substance is a polydimethyl siloxane elastomer.

21. The process as claimed in claim 19, wherein said substrate comprises at least a coating of gold and said self-assembled monolayers form on said gold.

22. The process as claimed in claim 19, wherein said patterned substrate is generated using photolithography.

23. The process as claimed in claim 19, wherein said patterned substrate is generated using electron beam lithography.

24. The process as claimed in claim 16, wherein said pattern comprises at least one subregion having a two-dimensional shape, wherein at least one dimension is in the 100–1000 nanometer range.

25. The process as claimed in claim 16, wherein said pattern comprises at least one subregion having a two-dimensional shape, wherein both dimensions are in the 100–1000 nanometer range.

26. The process as claimed in claim 16, wherein said pattern comprises a plurality of sub regions having two-dimensional shapes separated by barriers.

27. The process as claimed in claim 16, wherein the self-assembled monolayer terminates with a functional group selected from the group consisting of OH, $CO_2^-$, $SO_3^-$, $PO_3^-$, $NO_2$ and $NH_3^+$.

28. The process as claimed in claim 16, wherein the self-assembled monolayer is a rigid biphenyl thiol.

29. The process as claimed in claim 28, wherein the self-assembled monolayer terminates with a group selected form the group consisting of H, $CH_3$, $CF_3$, $C_6H_5$, F, Cl, Br, I, OH, SH, $NO_2$, $SCH_3$, $CO_2Et$, $OCH_2CH_2OCH_3$ and $N(CH_3)_2$).

30. A process for producing crystals having at least one dimension in the 100–1000 nanometer range, said process comprising the steps of:
  coating a master substrate with a substance that can be patterned;
  creating a pattern in said substance by a technique selected from the group consisting of microcontact printing, micromachining, focused ion beam writing, photolithography/lift off, and microwriting;
  creating a stamp of said pattern by casting a casting substance on said pattern;
  inking said stamp with an inking substance capable of forming a self-assembled monolayer to create an inked stamp;
  contacting said inked stamp to said substrate, wherein self-assembled monolayers form in the regions where said inked stamp and said substrate contact thereby forming said patterned substrate; and
  subjecting said patterned substrate to a supersaturated solution containing a compound of interest, wherein the compound of interest crystallizes within said patterned self-assembled monolayer to form crystals of the compound of interest and said pattern limits the growth of the crystals of the compound of interest.

31. The process as claimed in claim 30, wherein said casting substance is a polydimethyl siloxane elastomer and said substrate comprises at least a coating of gold and said self-assembled monolayers form on said gold.

32. The process as claimed in claim 31, wherein said patterned substrate is generated using a technique selected from the group consisting of photolithography and electron beam lithography.

33. The process as claimed in claim 32, wherein said pattern comprises at least one region having a two-dimensional shape, wherein at least one dimension is in the 100–1000 nanometer range.

34. The process as claimed in claim 33, wherein said pattern comprises at least one region having a two-dimensional shape, wherein both dimensions are in the 100–1000 nanometer range.

35. The process as claimed in claim 33, wherein said pattern comprises a plurality of regions having two-dimensional shapes separated by barriers.

36. A process for producing crystals having at least one dimension in the 1–5 micron range, said process comprising the steps of:

selecting a crystallizer comprising a controlled volume, wherein said crystallizer has at least one interior dimension in the 1–25 micron range; and introducing a supersaturated solution containing a compound of interest to said crystallizer, wherein the compound of interest crystallizes within said crystallizer to form crystals of the compound of interest and said at least one interior dimension limits the growth of the crystals of the compound of interest.

37. The process as claimed in claim 36, further comprising the step of maintaining at least a portion of the crystallizer at a constant temperature.

38. The process as claimed in claim 37, wherein said constant temperature is between 0° C. and 30° C.

39. The process as claimed in claim 36, wherein said supersaturated solution is introduced into said crystallizer via a pump.

40. The process as claimed in claim 36, further comprising the step of reducing the temperature of said supersaturated solution to a temperature where precipitation crystallization occurs.

41. The process as claimed in claim 36, wherein said crystallizer comprises a straight capillary tube.

42. The process as claimed in claim 41, further comprising the step of maintaining said supersaturated solution in said crystallizer for between 30 second and 300 minutes.

43. The process as claimed in claim 42, wherein said crystals have at least two crystal dimensions, and further comprising the step of removing said crystals from said crystallizer when a first crystal dimension is in the 5 micron or less range.

44. The process as claimed in claim 43, wherein the process is a plug-flow process and further comprising the step of flushing said crystal from said crystallizer when a first crystal dimension is in the 5 micron or less range and a second crystal dimension reaches a selected value.

45. The process as claimed in claim 36, further comprising the step of introducing an anti-solvent to the crystallizer with the supersaturated solution.

46. The process as claimed in claim 45, wherein said crystallizer comprises a first arm for introducing said supersaturated solution, a second arm for introducing said anti-solvent, and a reaction chamber in which said supersaturated solution and said anti-solvent mix resulting in the precipitation crystallization of said crystals.

47. The process as claimed in claim 46, further comprising the step of maintaining said supersaturated solution in said crystallizer for between 30 second and 600 minutes.

48. The process as claimed in claim 47, wherein said crystals have at least two crystal dimensions, and further comprising the step of removing said crystals from said crystallizer when a first crystal dimension is in the 5 micron or less range.

49. The process as claimed in claim 48, wherein the process is a plug-flow process and further comprising the step of flushing said crystal from said crystallizer when a first crystal dimension is in the 5 micron or less range and a second crystal dimension reaches a selected value.

50. A process for producing a crystal having at least one dimension in the 1–5 micron range, said process comprising the steps of:

selecting a crystallizer comprising a controlled volume, wherein said crystallizer comprises has at least one interior dimension in the 1–25 micron range;

introducing a supersaturated solution containing a compound of interest to said crystallizer, wherein the compound of interest crystallizes within said crystallizer to form at least one three-dimensional crystal of the compound of interest and said at least one interior dimension limits the growth in at least one dimension of the at least one crystal of the compound of interest;

allowing said at least one crystal to grow in a second dimension to a selected value; and removing said at least one crystal from said crystallizer.

51. The process as claimed in claim 50, wherein said crystallizer comprises a straight capillary tube.

52. The process as claimed in claim 51, further comprising the step of maintaining said supersaturated solution in said crystallizer for between 30 second and 300 minutes.

53. The process as claimed in claim 52, further comprising the step of maintaining at least a portion of the crystallizer at a constant temperature of between 0° C. and 30° C.

54. The process as claimed in claim 50, wherein said crystallizer comprises a first arm for introducing said supersaturated solution, a second arm for introducing said anti-solvent, and a reaction chamber in which said supersaturated solution and said anti-solvent mix resulting in the precipitation crystallization of said crystals.

55. The process as claimed in claim 54, further comprising the step of introducing an anti-solvent to the crystallizer with the supersaturated solution.

56. The process as claimed in claim 55, further comprising the step of maintaining said supersaturated solution in said crystallizer for between 30 second and 600 minutes.

* * * * *